United States Patent
Binkerd et al.

(10) Patent No.: US 6,455,434 B1
(45) Date of Patent: Sep. 24, 2002

(54) PREVENTION OF SLURRY BUILD-UP WITHIN WAFER TOPOGRAPHY DURING POLISHING

(75) Inventors: Chad R. Binkerd, Burlington, VT (US); Jose L. Cruz, Essex Junction, VT (US); Timothy C. Krywanczyk, Essex Junction, VT (US); Brian D. Pfeifer, Milton, VT (US); Rosemary A. Previti-Kelly, Burlington, VT (US); Patricia Schink, Burlington, VT (US); Amye L. Wells, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/001,562

(22) Filed: Oct. 23, 2001

(51) Int. Cl.⁷ .............................................. H01L 21/302
(52) U.S. Cl. ........................ 438/692; 438/633; 438/631
(58) Field of Search ................................ 438/692, 633, 438/631, 584

(56) References Cited

U.S. PATENT DOCUMENTS

| | | | | |
|---|---|---|---|---|
| 4,963,501 A | * | 10/1990 | Ryan et al. ......... 148/DIG. 111 |
| 5,718,618 A | | 2/1998 | Guckel et al. |
| 5,980,979 A | * | 11/1999 | Rohner ...................... 427/26.1 |
| 6,013,574 A | * | 1/2000 | Hause et al. ................ 438/622 |
| 6,173,240 B1 | * | 1/2001 | Sepulveda et al. .......... 700/121 |
| 6,180,527 B1 | | 1/2001 | Farnworth et al. |
| 6,184,138 B1 | * | 2/2001 | Ho et al. ..................... 438/631 |
| 6,191,086 B1 | | 2/2001 | Leon et al. |
| 6,194,317 B1 | * | 2/2001 | Kaisaki et al. .............. 438/633 |
| 6,218,316 B1 | | 4/2001 | Marsh |
| 6,251,789 B1 | * | 6/2001 | Wilson et al. ............... 438/584 |
| 6,274,483 B1 | * | 8/2001 | Chang et al. ................ 438/633 |
| 6,383,928 B1 | * | 5/2002 | Eissa .......................... 438/633 |
| 2002/0030282 A1 | * | 3/2002 | Merchant et al. ........... 257/774 |
| 2002/0033342 A1 | * | 3/2002 | Uzoh et al. .................. 205/118 |
| 2002/0048959 A1 | * | 4/2002 | Clevenger et al. .......... 438/692 |
| 2002/0055323 A1 | * | 5/2002 | McClain et al. .............. 451/41 |
| 2002/0070126 A1 | * | 6/2002 | Sato et al. ................... 205/640 |

* cited by examiner

Primary Examiner—John F. Niebling
Assistant Examiner—Olivia Luk
(74) Attorney, Agent, or Firm—Schmeiser, Olsen & Watts; Howard J. Walter, Jr.

(57) ABSTRACT

The present invention provides a method of preventing the build-up of polishing material within low areas of a substrate during polishing. Following the blanket deposition of a first layer, a selectively removable material is deposited over the first layer, wherein the selectively removable material fills the low areas. A surface of the substrate is polished removing the excess first layer and selectively removable material from the surface, leaving the first layer and selectively removable material within the low area. Following polishing, the selectively removable material is removed from the low areas prior to the deposition of a second layer.

10 Claims, 2 Drawing Sheets

PREVENTION OF SLURRY BUILD-UP WITHIN WAFER TOPOGRAPHY DURING POLISHING

BACKGROUND OF THE INVENTION

1. Technical Field

The present invention relates generally to the manufacture of semiconductor devices, and more particularly, to the prevention of slurry build-up within low areas of a substrate topography during polishing.

2. Related Art

FIG. 1 illustrates a related art substrate 10 having topography, in this example, a low area 12. A first layer 14 is deposited over the substrate 10, coating the sidewalls 16 and bottom 17 of the low area 12. Prior to depositing a second layer, the substrate 10 is polished to remove the excess first layer 14 on the surface 18 of the substrate 10, leaving the first layer 14 only within the low area 12. However, the polishing material 20, typically slurry, used during the polishing step often fills the low area 12, as illustrated in FIG. 2.

In order to remove the polishing material 20 within the low area 12, harsh chemicals, such as HF, an Amonium Hydroxide HGL clean, (also known in the industry as "Wang AB"), etc., are often required due to the strong mechanical bonds formed between the polishing material 20 and the first material 14 within the low area 12. These chemicals can permeate cracks in the substrate 10, and cause corrosion.

Accordingly, there is a need in the industry for a method that overcomes these and other problems.

SUMMARY OF THE INVENTION

The first general aspect of the present invention provides a method of preventing the build-up of polishing material within at least one low area of a substrate during polishing comprising: blanket depositing a first layer over the substrate; depositing a selectively removable material over the first layer, whereby the selectively removable material fills the at least one low area; polishing the substrate to remove the first layer and the selectively removable material from a surface of the substrate, leaving the first layer and the selectively removable material in the at least one low area; removing the selectively removable material from the at least one low area; and depositing a second layer over the substrate.

The second general aspect of the present invention provides a method of planarizing a substrate having at least one low area, comprising: depositing a first layer over the substrate; depositing a selectively removable material over the first layer; planarizing the substrate leaving the at least one low area, and the first layer and the selectively removable material within the at least one low area; and removing the selectively removable material from the low area.

The third general aspect of the present invention provides a method of planarizing a substrate comprising: depositing a selectively removable material within a low area of the substrate; planarizing a surface of the substrate; and removing the selectively removable material.

The fourth general aspect of the present invention provides a method of planarizing a substrate having at least one low area comprising: filling the low area with a selectively removable material prior to planarizing the substrate to prevent polishing material from building-up within the low area.

The foregoing and other features of the invention will be apparent from the following more particular description of the embodiments of the invention.

BRIEF DESCRIPTION OF THE DRAWINGS

The embodiments of this invention will be described in detail, with reference to the following figures, wherein like designations denote like elements, and wherein.

DESCRIPTION OF THE PREFERRED EMBODIMENTS

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc. Although the drawings are intended to illustrate the present invention, the drawings are not necessarily drawn to scale.

The present invention may be used in conjunction with any substrate having topography in which a first layer deposited within a low area is to be polished prior to the deposition of a second layer. For example, the present invention could be used in conjunction with alignment aids, the formation of dielectrics, the formation of metal lines, etc. For the purposes of illustration only, the present invention will be described wherein the topography forms alignment aids.

Figure 1:
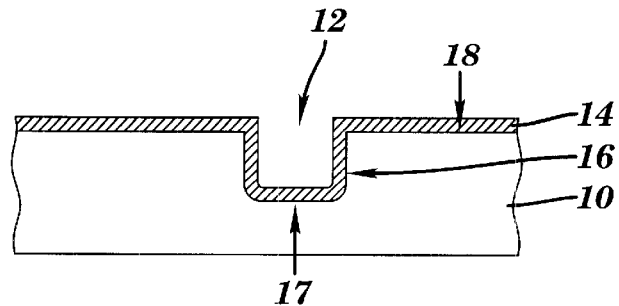
FIG. 1 depicts a related art substrate having a low area and a first layer deposited thereon.
Figure 2:
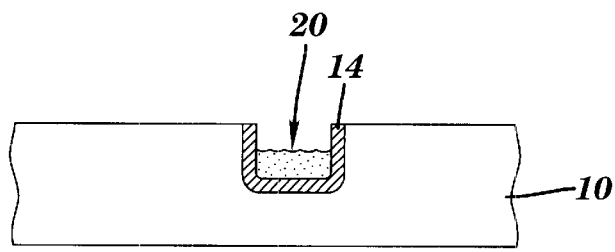
FIG. 2 depicts the related art substrate of FIG. 1 following a polishing step.
Figure 3:
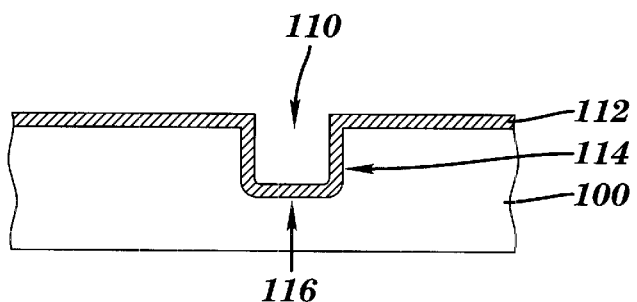
FIG. 3 depicts a structure having a low area and a first layer deposited thereon in accordance with the present invention.

Referring to the drawings, FIG. 3 depicts a portion of a substrate 100, in this example, a kerf region of a semiconductor wafer (the region of a semiconductor wafer beyond an active region where alignment aids are typically located). The substrate 100 may comprise several layers of oxide.

The substrate 100 includes topography, in this example, a single low area or recess 110 is shown, formed in accordance with conventional methods. The opening of the low area 110 is in the range of approximately 1 to 2 microns. It should be recognized that a single low area 110 is shown for ease of illustration only. The present invention is no way intended to be limited by this illustration.

A first layer 112 is deposited over the surface of the substrate 100 using known methods of deposition. The first layer 112 conformally coats the sidewalls 114 and bottom 116 of the low area 110. The first layer 112 may comprise tungsten, copper, or other similarly used materials. The first layer 112 forms an interconnect between the substrate 100 and the second layer that forms metal lines (described infra). The first layer 112 is deposited to a thickness in the range of approximately 3000 to 6000 Å.

Figure 4:
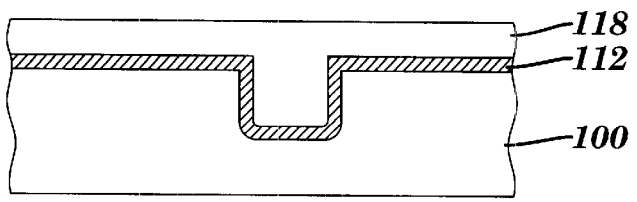
FIG. 4 depicts the structure of FIG. 3 having a selectively removable material deposited thereon in accordance with the present invention.

A layer of selectively removable material 118 is deposited over the substrate 100, filling the low area 110 and covering the first layer 112, as illustrated in FIG. 4. The selectively removable material 118 may comprise a mid-UV (ultra violet) photoresist, an organic spin-on glass, a polymer, a poyimide, or other material that may be easily removed during a later step. The selectively removable material 118 may be deposited using spin-on deposition techniques, or other known methods.

Figure 5:
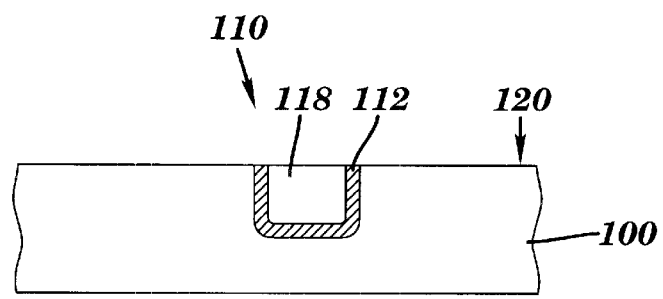
FIG. 5 depicts the structure of FIG. 4 following planarization in accordance with the present invention.
Figure 6:
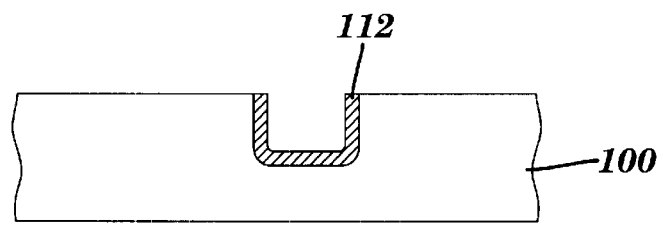
FIG. 6 depicts the structure of FIG. 5 following removal of the selectively removable material remaining within the low area in accordance with the present invention.

The selectively removable material 118 and the first layer 112 are selectively removed down to the surface 120 of the substrate 100, leaving the first layer 112 and the selectively removable material 118 within the low area 110, as illustrated in FIG. 5. The selectively removable material 118 and the first layer 112 may be removed using conventional polishing techniques, or other similar methods. An abrasive polishing material, such as slurry, for example, silica slurry, aluminum slurry, etc., may be used in conjunction with the polishing step, as known in the art.

The selectively removable material 118 remaining within the low area 110 is then removed using a solvent selective to the selectively removable material 118. For example, an organic solvent such as PGME, or other similar solvent, may be used because it is selective to the selectively removable material 118. Also, the organic solvent is not harmful to the remaining portions of the substrate 100, therefore, the remaining portions of the substrate 100 are not damaged during the removal of the selectively removable material 118.

Figure 7:
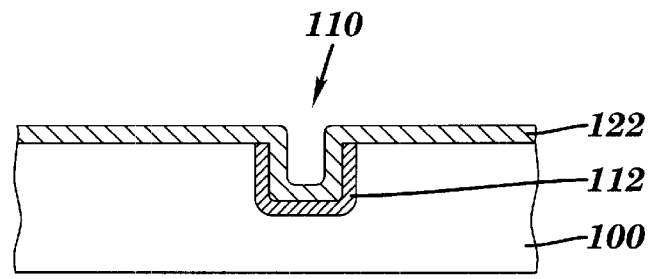
FIG. 7 depicts the structure of FIG. 6 having a second layer deposited thereon in accordance with the present invention.

As illustrated in FIG. 7, a second layer 122 is deposited over the substrate 100, conformally coating the first layer 112 within the low area 110. The second layer 122 may comprise aluminum, copper, or other similarly used material.

In this example, the low area 110, or alignment aid, is used because the second layer 122 is opaque. The low area 110 provides a reference point whereby the active region (not shown) of the substrate may be located during the selective removal of the second layer 122 in the formation of metal lines. Without the low area 110 it would be difficult to locate the active region, thus blanket depositions of opaque second layer 122 could not be used.

In the present invention the selectively removable material 118 is used to fill the low area 110 during the planarization of the surface 120 of the substrate 100 to remove the excess first layer 112. By filling the low areas 110, (which as mentioned above are needed to locate the active area of the substrate 100), the polishing material used during planarization does not build-up within the low area 110. Therefore, the destructive step requiring the use of harsh chemicals to remove excess polishing material within the low area 110, as described in the related art, is eliminated by the present invention.

Again, it should be understood that the present invention is intended for use in conjunction with any substrate having at least one low area in which a first layer is to be planarized prior to the deposition of a second layer. It is no way limited to alignment aids. The above was intended only as an example of one use for the present invention.

The first layer and second layer above were described as comprising conductive materials. It should be noted that the first layer and second layer may comprise an insulative material, a material comprising both an insulator and a conductor, etc. The first layer and second layer are in no way intended to be limited to conductive materials.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

We claim:

1. A method of preventing the build-up of polishing material within at least one low area of a substrate during polishing comprising:

blanket depositing a first layer over the substrate;

depositing a selectively removable material over the first layer, whereby the selectively removable material fills the at least one low area;

polishing the substrate to remove the first layer and the selectively removable material from a surface of the substrate, leaving the first layer and the selectively removable material in the at least one low area;

removing the selectively removable material from the at least one low area; and depositing a second layer over the substrate.

2. The method of claim 1, wherein the substrate comprises a semiconductor wafer.

3. The method of claim 1, wherein the at least one low area comprises an alignment aid.

4. The method of claim 1, wherein the first layer comprises a material selected from the group consisting of: tungsten and copper.

5. The method of claim 1, wherein the selectively removable material comprises a material selected from the group consisting of: photoresist and spin-on glass.

6. The method of claim 1, wherein polishing the substrate further comprises polishing the substrate with an abrasive polishing material.

7. The method of claim 6, wherein the abrasive polishing material comprises slurry.

8. The method of claim 1, wherein the selectively removable material is removed from the at least one low area using an organic solvent.

9. The method of claim 8, wherein the organic solvent comprises PGME.

10. The method of claim 1, wherein the second layer comprises a material selected from the group consisting of: aluminum and copper.

* * * * *